United States Patent [19]

Blanchard

[11] Patent Number: 4,952,992
[45] Date of Patent: Aug. 28, 1990

[54] METHOD AND APPARATUS FOR IMPROVING THE ON-VOLTAGE CHARACTERISTICS OF A SEMICONDUCTOR DEVICE

[75] Inventor: Richard A. Blanchard, Los Altos, Calif.

[73] Assignee: Siliconix Incorporated, Santa Clara, Calif.

[21] Appl. No.: 406,844

[22] Filed: Sep. 13, 1989

Related U.S. Application Data

[63] Continuation of Ser. No. 87,055, Aug. 18, 1987, abandoned.

[51] Int. Cl.⁵ .............................................. H01L 29/78
[52] U.S. Cl. .................................... 357/23.4; 357/15
[58] Field of Search .................... 357/23.4, 15, 90

[56] References Cited

U.S. PATENT DOCUMENTS

| | | | |
|---|---|---|---|
| 4,521,795 | 6/1985 | Coe | 357/23.4 |
| 4,587,713 | 5/1986 | Goodman | 357/23.4 |
| 4,630,084 | 12/1986 | Tihanyi | 357/23.4 |
| 4,675,713 | 6/1987 | Terry et al. | 357/23.1 |
| 4,694,313 | 9/1987 | Beasom | 357/86 |
| 4,720,734 | 1/1988 | Amemiya | 357/13 |
| 4,831,423 | 5/1989 | Shannon | 357/23.8 |

FOREIGN PATENT DOCUMENTS

| | | | |
|---|---|---|---|
| 61-49474 | 3/1986 | Japan | 357/15 |
| 61-150280 | 7/1986 | Japan | 357/15 |
| 2177848 | 1/1987 | United Kingdom | 357/15 |

OTHER PUBLICATIONS

Johnny K. O. Sin, et al., "The SINFET-A Schottky Injection MOS-Gated Power Transistor", IEEE Transactions on Electron Devices, vol. ED-33, No. 12, Dec. 1986, pp. 1940-1947.

Primary Examiner—Andrew J. James
Assistant Examiner—Mark Prenty
Attorney, Agent, or Firm—Skjerven, Morrill, MacPherson, Franklin & Friel

[57] ABSTRACT

A semiconductor device is disclosed which utilizes a Schottky-barrier diode to inject minority carriers into the device.

9 Claims, 3 Drawing Sheets

METHOD AND APPARATUS FOR IMPROVING THE ON-VOLTAGE CHARACTERISTICS OF A SEMICONDUCTOR DEVICE

This application is a continuation of application Ser. No. 087,055, filed Aug. 18, 1987, and now abandoned.

BACKGROUND OF THE INVENTION

1. Field of the Invention

This invention relates to double diffused MOS (DMOS) transistors. More particularly, the invention relates to a new DMOS device having a minimized on-voltage and processes for manufacture of such devices.

2. Description of the Prior Art

A typical, conventional DMOS device 1 is illustrated in FIG. 1. Device 1 is comprised of lightly N-doped epitaxial layer 2, heavily P-doped body regions 3 and 4, and heavily N-doped source regions 5 and 6. As is conventional with this type of device, the body and source regions are electrically connected with metallizations on the upper surface. In FIG. 1, such metallization section is indicated at 7 for body region 3 and source region 5. Metallization section 7 is electrically connected to a source terminal 9. Insulating layer 10, typically of silicon dioxide material, covers the central region of device 1. Gate electrode 11 is located on insulating layer 10, positioned above the central portion of device 1 and extends over channel regions 12 and 13. Electrical connection is made to gate 11 in the usual manner and brought out to gate terminal 14. Similarly, device 1 includes drain terminal 15 which is electrically connected to heavily N-doped region 16.

A typical DMOS transistor of the prior art, such as device 1, has a theoretical minimum voltage drop per unit area which is determined by the drain-to-source voltage ($V_{DS}$) that it must sustain. This operating voltage sets both the minimum thickness and minimum resistivity of the epitaxial silicon region 2, between the bottom of the diffused body regions 3 and 4 and the heavily doped N+substrate 16 which is connected to drain terminal 15.

A variety of structures have been proposed to minimize the on-voltage of DMOS transistors and similar MOS-gated devices. The insulated gate bipolar transistor (IGBT) achieves a reduction in on-voltage by using a heavily doped substrate of conductivity type opposite to that of the epitaxial layer which injects carriers across the pn-junction into the lightly doped drain region, thus modulating the conductivity of this region. Although a reduction in on-voltage is obtained through this method, there is a diode offset in the current-voltage characteristics. Another problem with this attempted solution is that the presence of injected carriers increases the switching time of the IGBT. Additionally, care must be taken not to inadvertently activate the parasitic NPN-PNP structure, or latch-up will occur.

Another approach for reducing the on-voltage of DMOS transistors is to include a separate region that may be biased to inject carriers into the lightly doped drain region. Such a device is illustrated in FIG. 2 and is indicated by reference character 1a. Device 1a differs from device 1 of FIG. 1 by the addition of highly P-doped region 17, which is positioned remote from the channel regions 12a and 13a, and which is separately biased. There are several disadvantages to device 1a, the first of which is that injection of minority carriers into the drain region reduces switching speed since these carriers must either be removed by fields at the terminals or must recombine before the device may be switched off. A further disadvantage is the presence of the P-type region that injects holes into the N-type drain region, since this arrangement can lead to inadvertent latch-up because of the lateral PNPN structure.

Another attempt to reduce the on-voltage of a DMOS device is illustrated in U.S. Pat. No. 4,630,084 to Tihanyi, issued Dec. 16, 1986. In the Tihanyi device a P-type injecting region is equally spaced between adjacent channel regions and this injecting region is electrically connected to the gate. There are several disadvantages to this attempted solution in the reduction of on-voltage. With the gate tied to the P-injecting region, the gate no longer has a high impedance characteristic of a normal DMOS transistor and both the input impedance and the amount of current injected are determined by the resistance connected between the gate terminal and the P-injector region. With the gate biased positive with respect to the drain, injected carriers modulate the conductivity of the lightly doped drain region. The injection of minority carriers in a drain region reduces the switching speed of this device because these carriers must either recombine or be removed by fields at the terminals before the device can be fully turned off. Yet another disadvantage of the Tihanyi type device is that the presence of the P-type region that injects holes into the N-type drain region may lead to an inadvertent latch-up condition because of the presence of the lateral PNPN structure. Looking at the device in Tihanyi, the PNPN structure is found by observing that the injector is P-type, the drain zone N-type, the channel is of P-type material and finally the source consists of N-type material. With this configuration, if the product of the current gains of the PNP and the NPN transistor exceeds one, the potential exists for latch-up to occur.

SUMMARY OF THE INVENTION

It is an object of this invention to provide a semiconductor device with improved switching characteristics which overcomes the disadvantages of the prior art, such as reduced switching speed and the propensity for latch-up.

It is a further object of this invention to provide methods of producing semiconductor devices with improved switching characteristics which overcome the aforementioned disadvantages of the prior art.

In accordance with one feature of the invention, a semiconductor device is provided which comprises a substrate of first conductivity type, a first region of conductivity type opposite said first conductivity type extending into said substrate from a surface of said substrate, a second region of first conductivity type in said first region and extending into said first region to a depth less than that which said first region extends into said substrate, a drain region adjacent to said first region and extending to said surface, a channel region along said surface between said second region and said drain region, an insulating layer disposed on said surface of said substrate over said channel region, a gate electrode disposed on part of said insulating layer and positioned over the channel region and a material disposed on said surface of said substrate, said material being positioned on the surface of the substrate adjacent to where the drain region extends to said substrate surface, and the composition of said material being such that a Schottky-barrier diode is formed by said material and said substrate.

In accordance with another feature of this invention, a semiconductor device according to the foregoing is provided in which the second region is of a material that contributes electrons to the conduction process when deposited on the first region of the opposite conductivity type when the first region is P-type material (and holes when the first region is of N-type material), forming a Schottky source for said device.

In accordance with yet another feature of the invention, there is provided a semiconductor device comprising a substrate of first conductivity type, a first region of conductivity type opposite said first conductivity type extending into said substrate from a surface of said substrate, a second region of first conductivity type in said first region and extending into said first region to a depth less than that which said first region extends into said substrate, said second region having a doping concentration only slightly greater than the doping concentration of said first region, a drain zone adjacent to said first region and extending to said surface, a channel region along said surface between said second region and said drain region, an insulating layer disposed on said surface over said channel region and a gate electrode disposed on a portion of said insulating layer and positioned over the channel region and a material disposed on said surface of said substrate, said material being positioned on the surface of the substrate adjacent to where the drain region extends to said substrate surface, and the composition of said material being such that a Schottky-barrier diode is formed by said material and said substrate.

In accordance with an additional feature of the invention, a method of forming an improved semiconductor device is provided, which method comprises: providing a substrate of first conductivity type; establishing in said substrate a first region of second, opposite conductivity type which extends into said substrate from a surface of said substrate; establishing in said first region a second region of first conductivity type having a doping concentration only slightly greater than the doping concentration of said first region and extending from said surface to a lesser depth than said first region extends into said substrate thereby forming a channel region extending to said surface; depositing an insulating layer over a portion of said substrate covering said channel region at said substrate surface; providing a gate electrode on said insulating layer positioned over the channel region; and providing a material on said surface of said substrate, said material being positioned on the surface of the substrate adjacent to where the drain region extends to said substrate surface, and the composition of said material being such that a Schottky-barrier diode is formed by said material and said substrate.

In accordance with an additional feature of the invention, a method of forming an improved semiconductor device is provided, which method comprises: providing a substrate of first conductivity type; establishing in said substrate a first region of second, opposite conductivity type which extends into said substrate from a surface of said substrate; establishing in said first region a second region of first conductivity type extending into said first region from said surface to a depth less than that which said first region extends into said substrate, thereby forming a channel region which extends to said surface; providing a material on said surface, adjacent to said channel region, the composition of said material being such that a Schottky-barrier diode is formed by said material and said substrate; depositing an insulating layer over a portion of said surface covering said channel region at said substrate surface; and providing a gate electrode on said insulating layer positioned over the channel region.

BRIEF DESCRIPTION OF THE DRAWINGS

Other objects and advantages of the invention will become apparent from study of the specification and drawings, in which.

DESCRIPTION OF THE PREFERRED EMBODIMENTS

Figure 1:
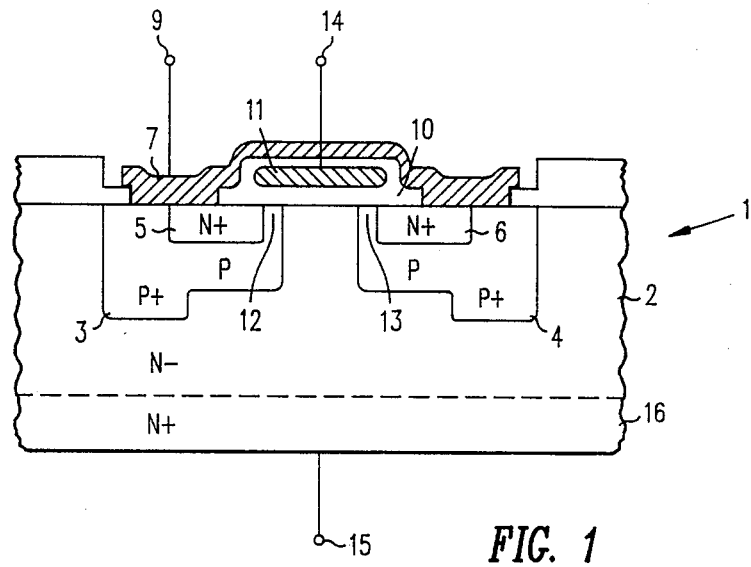
FIGS. 1 and 2 illustrate prior art devices relating to the present subject matter.
Figure 2:
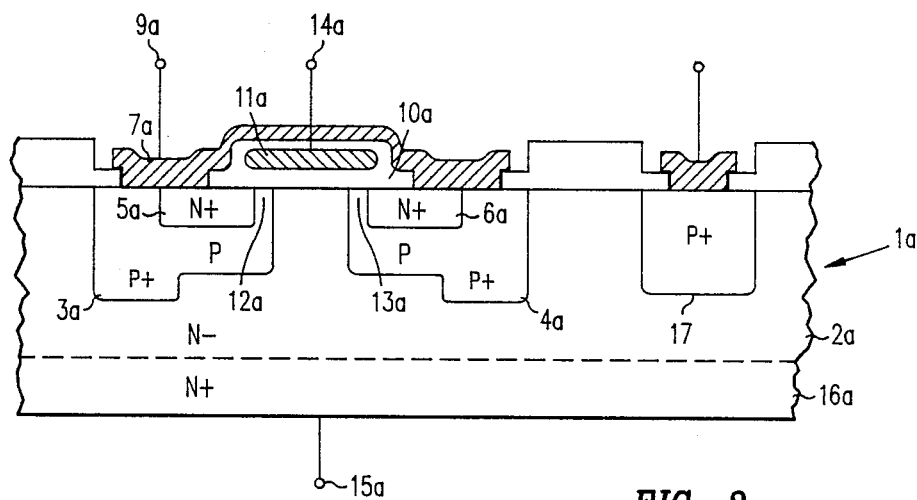
Figure 3:
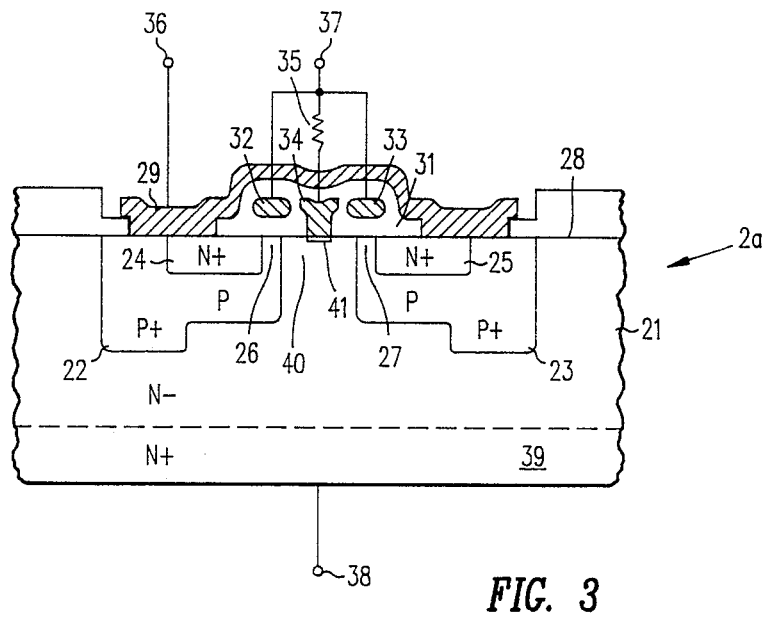
FIG. 3 shows a device in cross section illustrating a first embodiment of the invention.

Referring to FIG. 3, semiconductor device 20, illustrating the first embodiment of the invention, is shown in cross section. Device 20 includes lightly N-doped substrate 21. Body regions 22 and 23 of P-doped material are formed in substrate 21 by means of, for example, diffusion and extend into substrate 21 from surface 28. Device 20 further includes source regions 24 and 25, which may be formed, for example, also by diffusion, and extend into body regions 22 and 23, respectively, from surface 28. The varying diffusions form channels 26 and 27 which extend to surface 28. Metal contact 29 is formed on surface 28 and contacts paired body and source regions 22/24 and 23/25, respectively, therebelow. Insulating layer 31, which may consist of silicon dioxide material, is formed over the surface 28. Formed on insulating layer 31 are gate electrode portions 32 and 33 which may be composed of polysilicon. Material 34 is deposited on surface 28 of substrate 21 and is positioned between gate electrodes 32 and 33. Material 34 is selected to be of the type which, upon contact with substrate 21, forms a Schottky-barrier diode. Those skilled in the art will be familiar with the formation of such diode which results when certain materials contacts lightly N-doped material, such as substrate 21. Material 34 could be a refractory metal, such as molybdenum, or a silicide, examples of which include platinum silicide, titanium silicide and tungsten silicide. In this embodiment, Schottky forming material 34 is electrically connected to gate electrodes 32 and 33 by resistive element 35. Alternatively, in operation of device 20, material 34 may be separately biased with a positive voltage when conduction is desired and it is therefore possible to operate device 20 as a four-terminal device. As shown in FIG. 3, source region 24 and body region 22 along with source region 25 and body region 23 are commonly electrically connected to source terminal 36; gate electrodes 32 and 33 are commonly connected to gate terminal 37; and drain terminal 38 is connected to substrate 21 via highly N-doped region 39.

In operation, application of a positive potential to terminal 37 causes the injection of minority carriers (holes in the configuration of FIG. 3) into drain region 40. Charge neutrality requires that the concentration of holes in this region rise; the accompanying electrons modulate the resistivity of drain region 40. The edge of the space charge layer is indicated in this figure by reference character 41 and illustrates the barrier height of the Schottky diode. By optimizing the Schottky barrier height, sufficient minority carriers are injected to modulate the conductivity of the drain region without serious reduction in switching speed. Modulating the conductivity of drain region 40 in the foregoing manner avoids the disadvantages encountered with prior art devices employing P-doped injection regions. Another advantage of the Schottky-barrier diode implementation is that the Schottky emitter also produces a PNP transistor with very low current gain, making latch-up unlikely.

The Schottky barrier height is optimized by choice of Schottky metallization and by adjusting the surface concentration of the lightly doped N-region where the Schottky diode is to be formed. Such optimization of surface concentration may be achieved by introducing dopant atoms (by ion implantation, for example) and redistributing them using a thermal processing step. Although device 20 is illustrated as a three-terminal device (resistor 35 connecting gate terminal 37 to material 34), it is possible to utilize this device in a four-terminal configuration, with the injecting Schottky region separate from the gate, constituting a fourth terminal.

Figure 4:
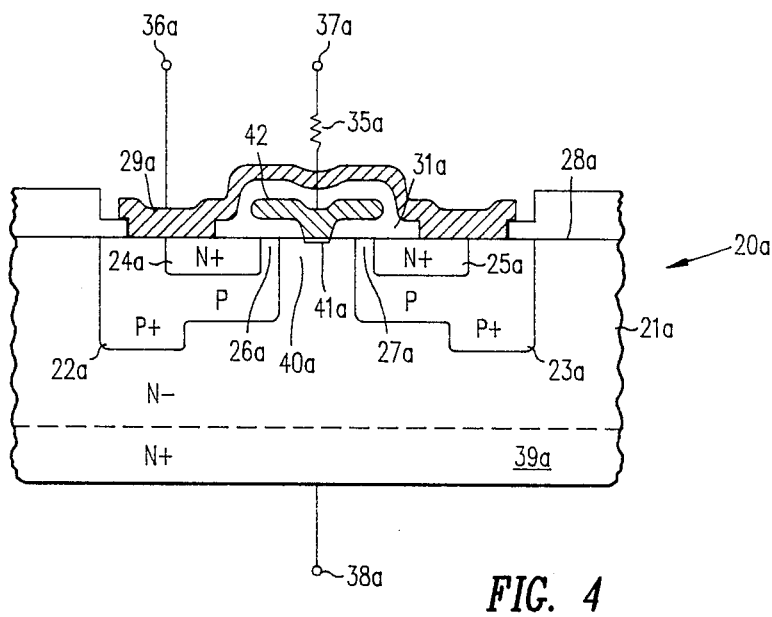
FIG. 4 shows a device in cross section illustrating a second embodiment of the invention.

The second embodiment of the present invention is illustrated in FIG. 4. In this embodiment, unitary structure 42 is formed over insulating layer 31a, the composition of structure 42 being selected from the group of materials that will perform both a gating function and a Schottky-barrier diode forming function. Examples of suitable kinds of materials for this function are (i) silicides, such as platinum silicide, titanium silicide or tungsten silicide, or (ii) a refractory metal, such as molybdenum. Use of a silicide or refractory metal permits subsequent high-temperature processing steps. In addition, some silicides can be oxidized to form a layer of silicon dioxide on their surface, while dielectrics may be deposited at high temperature on refractory metals.

Figure 5:
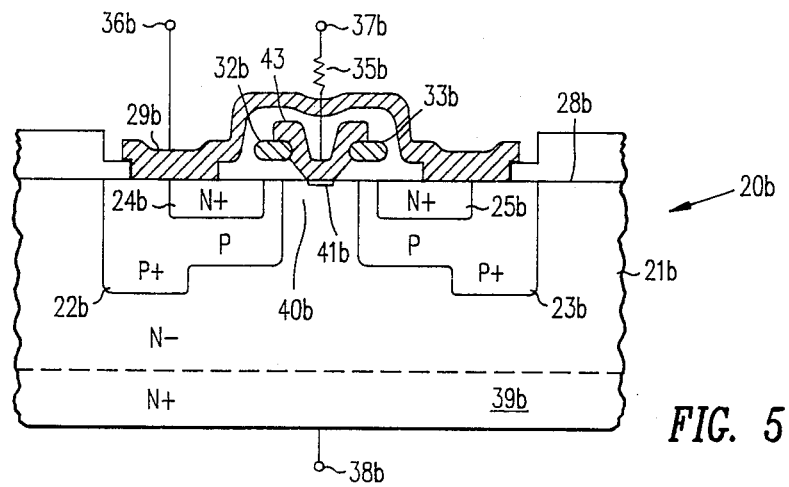
FIG. 5 shows a device in cross section illustrating a third embodiment of the invention.

A third embodiment of the present invention is illustrated in FIG. 5. In this embodiment, gates 32b and 33b are composed of a first type of electrode material, such as polysilicon, for example, and by a subsequent step material 43 is formed and extends between gate electrodes 32b and 33b, contacting those electrodes as well as surface 28b. The composition of material 43 is of a type which forms a Schottky-barrier diode when contacting substrate 21b and may be, for example, a refractory metal or silicide, which may be selected from the group of materials cited above in connection with FIG. 4.

Figure 7:
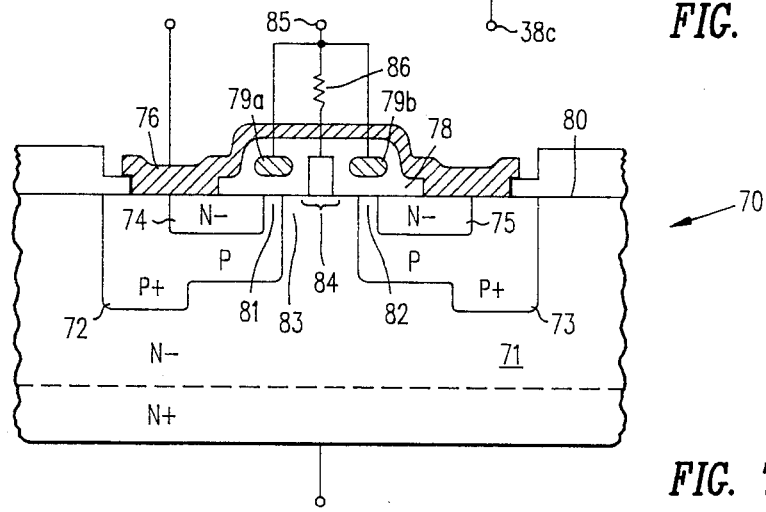
FIG. 7 illustrates, in cross section, a fifth embodiment of the invention.

The characteristics of the parasitic NPN transistor formed in MOS devices, such as those illustrated in FIGS. 3, 4 and 5, by source 24, body 22 and drain, consisting of lightly doped N-type substrate 21 and heavily doped N-type region 39, may influence device operation and latch-up susceptibility. To overcome potential latch-up, a process sequence that produces an NPN transistor with low current gain may be employed. One method for achieving low current gain is to minimize the doping concentration in the source regions, which results in a reduced emitter injection efficiency. Attention is directed to FIG. 7, wherein device 70, illustrated in cross section, is shown. Device 70 is comprised of substrate 71 of lightly doped N-type material, P-doped body regions 72 and 73, including relatively lightly N-doped source regions 74 and 75 respectively. More particularly, the net peak doping concentration of source regions 74 and 75 should be in the range of two to four times the net peak doping concentration of their respective body regions 72 and 73 directly below the source region. Thus the preferable range of source doping concentration is that, taking one source/body region pair as an example, source region 74 would have a net peak doping concentration of at least twice the net peak doping concentration of body region 72 directly below the source region 74 but the net peak doping concentration of source region 74 would not be greater than four times the net peak doping concentration of body region 72 directly below the source region 74. In accordance with traditional practice, the body and source regions are connected by metallizations, which in FIG. 7 is metallization 76, contacting body region 72 and source region 74 and body region 73 and source region 75. Insulating layer 78, typically of silicon dioxide, is deposited on surface 80 of substrate 71 and extends over channel regions 81 and 82, which extend to surface 80, as well as covering drain region 83. Schottky-barrier diode 84 is electrically connected to gate terminal 85 via resistor 86 and injects minority carriers to modulate the conductivity of drain region 83. Gates 79a and 79b which may be composed of polysilicon material, are formed on insulating layer 78 and extend above channel regions 81 and 82 respectively. By reducing the emitter injection efficiency, such as is illustrated in device 70, the latch-up potential of the parasitic PNPN SCR is eliminated. It will of course also be appreciated that an exemplary device may be produced which utilizes both the Schottky-barrier diode of any of FIGS. 3–5 to modulate the conductivity of the drain region, as heretofor illustrated, and utilizes a source region having a doping concentration with respect to its body region as described above with respect to FIG. 7.

Figure 6:
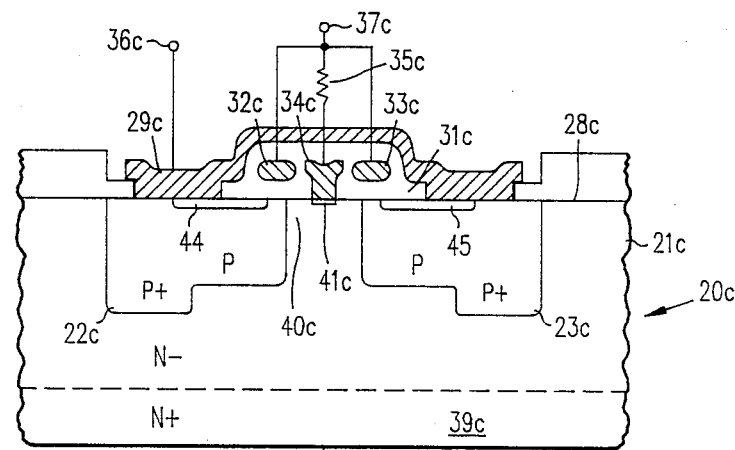
FIG. 6 shows a device in cross section in accordance with a fourth embodiment of the invention.

Another approach which may be used to accomplish elimination of potential for latch-up is to utilize a Schottky-barrier diode as the source for the device. One embodiment of this approach is illustrated in FIG. 6. Referring to FIG. 6, source regions 44 and 45, of lightly doped N-type material, are formed in body regions 22c and 23c respectively. Metal contact 29c serves as the contact to the Schottky diodes formed at respective source regions 44 and 45 and to body regions 22c and 23c. In this embodiment, Schottky source regions 44 and 45 contribute electrons to the conduction process since body regions 22c and 23c are of P-type material. If the device were constructed such that body regions 22c and 23c were of N-type material, then Schottky source regions 44 and 45 would contribute holes to the conduction process via the Schottky diode. As heretofore mentioned, the low carrier injection efficiency (i.e., emitter injection efficiency) of these Schottky source regions helps eliminate the potential for latch-up. The low current gain of the transistor formed by the source, the body, and the drain of the intrinsic transistor eliminates any chance of latch-up that may exist in the structures of FIGS. 3, 4, or 5.

Although the invention has been disclosed in a vertical device, it is of course applicable to lateral devices as well. It is also of course also understood that the scope of the invention is not to be determined by the above description, but only by the following claims.

I claim:

1. A semiconductor device comprising a substrate of first conductivity type, a first region of conductivity type opposite said first conductivity type extending into said substrate from a surface of said substrate, a second region of first conductivity type in said first region and extending into said first region into a depth less than that which said first region extends into said substrate, a drain region adjacent to said first region and extending to said surface, a channel region along said surface between said second region and said drain region, an insulating layer disposed on said surface of said substrate over the channel region, a gate electrode having first and second portions, with said first portion of said gate electrode being disposed on part of said insulating layer and positioned over the channel region, with said second portion of said gate electrode disposed on said surface of said substrate and being positioned adjacent where the drain region extends to said substrate surface, the composition of said gate electrode being such that a Schottky-barrier diode is formed by the contact of said second portion of said gate electrode and said substrate.

2. The device at claim 1 wherein said gate electrode is composed of a silicide material.

3. The device of claim 1 wherein said gate electrode is composed of a refractory metal.

4. A device according to any of claims 2-3 or 1, further including a second material contacting said second region, wherein the composition of said second material is such that the interaction between said second material and said second region forms a Schottky source for said device.

5. A semiconductor device comprising a substrate of first conductivity type, a first region of conductivity type opposite said first conductivity type extending into said substrate from a surface of said substrate, a second region of first conductivity type in said first region and extending into said first region to a depth less than that which said first region extends into said substrate, a drain region adjacent to said first region and extending to said surface, a channel region along said surface between said second region and said drain region, an insulating layer disposed on said surface of said substrate over the channel region, a gate electrode composed of a first material disposed on part of said insulating layer and positioned over the channel region, and a second material having a composition different than said gate electrode and being disposed on said surface of said substrate, said second material being positioned on the surface of the substrate adjacent where the drain region extends to said substrate surface and having a portion thereof physically contacting said gate electrode, and the composition of said second material being such that a Schottyky-barrier diode is formed by said second material and said substrate.

6. The device of claim 5, wherein said second material is a silicide.

7. The device of claim 5, wherein said second material is a refractory metal.

8. A device according to any of claims 5-7, further including a third material contacting said second region, wherein the composition of said third material is such that the interaction between said third material and said second region forms a Schottky source for said device.

9. A device of any of claims 2-3 or 5-7 and 1, wherein said first conductivity type is N.

* * * * *